(12) United States Patent
Shiono

(10) Patent No.: US 7,374,612 B2
(45) Date of Patent: May 20, 2008

(54) METHOD OF PRODUCING SINGLE-POLARIZED LITHIUM TANTALATE CRYSTAL AND SINGLE-POLARIZED LITHIUM TANTALATE CRYSTAL

(75) Inventor: Yoshiyuki Shiono, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 355 days.

(21) Appl. No.: 10/942,960

(22) Filed: Sep. 17, 2004

(65) Prior Publication Data

US 2005/0066879 A1    Mar. 31, 2005

(30) Foreign Application Priority Data

Sep. 26, 2003  (JP) .............................. 2003-334654

(51) Int. Cl.
*C30B 29/30*   (2006.01)

(52) U.S. Cl. ................. 117/2; 117/3; 117/941

(58) Field of Classification Search ............ 117/2, 117/3, 941
See application file for complete search history.

(56) References Cited

U.S. PATENT DOCUMENTS

| | | | |
|---|---|---|---|
| 4,371,419 A | * | 2/1983 | Fukuda et al. ................ 117/27 |
| 5,323,262 A | * | 6/1994 | Mizuuchi et al. ............ 359/332 |
| 5,910,699 A | * | 6/1999 | Namba et al. ............... 310/320 |
| 6,348,094 B1 | | 2/2002 | Shiono et al. |
| 2006/0169196 A1 | | 8/2006 | Shiono |

FOREIGN PATENT DOCUMENTS

| | | |
|---|---|---|
| EP | 0 893 515 A1 | 1/1999 |
| EP | 1 043 617 A1 | 10/2000 |
| JP | A 53-109900 | 9/1978 |
| JP | A 54-12587 | 1/1979 |
| JP | A 57-3800 | 1/1982 |
| JP | A 58-151399 | 9/1983 |
| JP | A 10-1391 | 1/1998 |
| JP | 11-92147 | 4/1999 |
| WO | WO 01/33260 A1 | 5/2001 |
| WO | WO 2004/002891 A1 | 1/2004 |

\* cited by examiner

*Primary Examiner*—Robert Kunemund
(74) *Attorney, Agent, or Firm*—Oliff & Berridge PLC

(57) ABSTRACT

A method of producing a lithium-tantalate crystal comprising, at least subjecting a single-polarized lithium-tantalate crystal wherein an optical absorption coefficient at a wave number of 3480 cm$^{-1}$ is 0.3 cm$^{-1}$ or less to a heat treatment under a reducing atmosphere at a temperature of not lower than 250° C. and not higher than Curie temperature and a single-polarized lithium-tantalate crystal wherein an optical absorption coefficient at a wave number of 3480 cm$^{-1}$ is 0.3 cm$^{-1}$ or less and an electric conductivity is $1\times10^{-12}$ $\Omega^{-1} \cdot$cm$^{-1}$ or more. There can be provided a method of producing a single-polarized lithium-tantalate crystal in a short time efficiently wherein the surface charge generated due to a pyroelectric property can be decayed quickly by improving the electric conductivity and a single-polarized lithium-tantalate crystal.

10 Claims, No Drawings

METHOD OF PRODUCING SINGLE-POLARIZED LITHIUM TANTALATE CRYSTAL AND SINGLE-POLARIZED LITHIUM TANTALATE CRYSTAL

BACKGROUND OF THE INVENTION

1. Field of the Invention

The present invention relates to a method of producing a single-polarized lithium tantalate crystal and a single-polarized lithium tantalate crystal which is used for the application wherein a pattern is formed with a metal electrode on a wafer to process an electrical signal such as a surface acoustic wave device.

2. Description of the Related Art

Lithium tantalate is used for the application which utilizes its electrical properties, such as a SAW device which performs a signal processing using a surface acoustic wave (SAW). In this application, the single-polarized lithium-tantalate crystal is used. The lithium-tantalate crystal suitable for this purpose shows a piezoelectric response (piezoelectric property) originated from the crystal structure thereof and needed for a SAW device. However, the lithium-tantalate crystal obtained by a general method has a pyroelectric response (pyroelectric property), in addition to the piezoelectric property.

A piezoelectric property of a lithium-tantalate crystal is essential characteristic when using the lithium-tantalate crystal as a SAW device. On the other hand, a pyroelectric property is observed as a surface charge generated on an external surface of a lithium-tantalate crystal by applying a temperature change to the crystal, and charges the crystal with electricity. It is considered that, when using a lithium-tantalate crystal as a SAW device, the surface charge causes a spark discharge between metal electrodes formed on the wafer consisting of a lithium-tantalate crystal, which causes a significant defect in a performance of the SAW device. For this reason, in a design of a SAW device using a lithium-tantalate crystal, there are needed an artifice for preventing the generation of a surface charge, an artifice for discharging the surface charge, an artifice for making an interval between metal electrodes large, or the like. There is the disadvantage that the design of the SAW device itself is restricted in order to take these artifices in the design.

Moreover, in the process of producing a SAW device using a lithium-tantalate crystal, there is a process of heating the lithium-tantalate crystal in processes such as deposition of a metal film and removal of a resist. If a temperature change such as elevation or lowering of temperature is applied to the lithium-tantalate crystal in these processes, a charge will be generated on the external surface due to the pyroelectric property of the lithium-tantalate crystal. As mentioned above, a spark discharge is generated between metal electrodes due to this surface charge, and causes the breakage of the electrode pattern. Therefore, artifices are considered so that a temperature change may not be applied as possible, or so that a temperature change may be gentle in the process of producing the SAW device. These artifices may cause disadvantages that the throughput of the production process is lowered, and that the margin which guarantees the performance of the SAW device becomes narrow.

Although the charge on the external surface generated due to the pyroelectric property is neutralized by the free charge from the surrounding environment and decayed with time in the single-polarized lithium-tantalate crystal produced by the usual method, the decay time is long as several hours or more, and thus it is not industrial to decay the generated surface charge by such natural neutralization in the process of producing the SAW device.

From the above-mentioned background, there has been increased a demand for the piezoelectric crystal in which the generation or accumulation of the charge is not observed on the external surface of the crystal with maintaining the piezoelectric property needed, in order to achieve device characteristics for the application like a SAW device, and there has been needed a single-polarized lithium-tantalate crystal in which the accumulation of the surface charge is not observed for such a application.

As a method for producing a lithium-tantalate crystal in which the surface charge is decreased, there is disclosed a method wherein a lithium-tantalate crystal is exposed to a reducing atmosphere at 500° C. or more to increase the electric conductivity, and thereby the surface charge generated due to the pyroelectric property is quickly neutralized or decayed (see Japanese Patent Application Laid-open (Kokai) No. 11-92147 (Table 1)).

SUMMARY OF THE INVENTION

However, if the lithium-tantalate crystal is reduced according to the method as described above, the single polarized structure needed for the application to the SAW device is lost in the case that the reducing atmosphere temperature is 610° C., which is the Curie temperature of a lithium tantalate, or more. In the case that the reducing atmosphere temperature is 610° C. or less, even if a lithium-niobate crystal which is said to have a fast reaction rate is used, a surface resistance after heating, for example, at 500° C. is still be large as 1.2E+14 Ω. So a reducing rate is very slow. As a result, the electric conductivity of a single-polarized lithium-tantalate crystal cannot be improved industrially.

The present invention has been accomplished to solve the above-mentioned problems, and an object of the present invention is to provide a method of producing a single-polarized lithium-tantalate crystal and a single-polarized lithium-tantalate crystal in which the surface charge generated due to the temperature change or the like applied to the lithium tantalate in the production process of the SAW device or the like can be quickly decayed without being accumulated by improving the electric conductivity of the lithium tantalate.

To achieve the above-mentioned object, the present invention provides a method of producing a lithium-tantalate crystal comprising, at least subjecting a single-polarized lithium-tantalate crystal wherein an optical absorption coefficient at a wave number of 3480 $cm^{-1}$ is 0.3 $cm^{-1}$ or less to a heat treatment under a reducing atmosphere at a temperature of not lower than 250° C. and not higher than Curie temperature.

As described above, by subjecting a single-polarized lithium-tantalate crystal wherein an optical absorption coefficient at a wave number of 3480 $cm^{-1}$ is 0.3 $cm^{-1}$ or less to a heat treatment under a reducing atmosphere at a temperature of not lower than 250° C. and not higher than Curie temperature, the lithium-tantalate crystal wherein the electric conductivity is made high with keeping a single-polarized structure can be produced effectively in a short time. Moreover, in this case, it is more preferable that the above-mentioned optical absorption coefficient is 0.15 $cm^{-1}$ or less.

Moreover, it is preferable to use a wafer subjected at least to a slicing process, a wafer subjected to a lapping process, or a wafer of which a single side is subjected to a mirror polishing process as the single-polarized lithium-tantalate crystal.

Since the method of the present invention can be applied to any lithium-tantalate crystal irrespective of its feature as far as it is lithium-tantalate crystal wherein an optical absorption coefficient at a wave number of 3480 cm$^{-1}$ is 0.3 cm$^{-1}$ or less, it may be applied to the crystal before being subjected to a slicing process, for example. However, if a wafer subjected at least to a slicing process, a wafer subjected to a lapping process, or a wafer of which a single side is subjected to a mirror polishing process is subjected to the above-mentioned heat treatment, the surface of the wafer on which a device is to be formed can be heat-treated more promptly.

Moreover, it is preferable that the reducing atmosphere is either of hydrogen, deuterium, carbon monoxide and NOx (X<2.5), or a mixed gas consisting of two or more of them.

If such a reducing gas or a mixed gas thereof is suitably selected and used as a reducing atmosphere, the above-mentioned heat treatment under the reducing atmosphere can be performed easily.

In this case, one or more of gas selected from rare gases such as helium, neon, argon or the like, nitrogen, and carbon dioxide may be added further to the reducing atmosphere. The reaction rate of the heat treatment under the reducing atmosphere can be controlled by adding the non-reducing gas, and thereby the heat treatment time can be adjusted.

The present invention also provides a single-polarized lithium-tantalate crystal wherein an optical absorption coefficient at a wave number of 3480 cm$^{-1}$ is 0.3 cm$^{-1}$ or less and an electric conductivity is $1\times10^{-12}$ $\Omega^{-1}\cdot$cm$^{-1}$ or more.

If an optical absorption coefficient thereof at a wave number of 3480 cm$^{-1}$ is 0.3 cm$^{-1}$ or less, the lithium-tantalate crystal can be such that a color within a wafer surface is less uneven when the wafer is colored with dark gray by a reduction process and an electric conductivity within the wafer is evener. And if an electric conductivity thereof is $1\times10^{-12}$ $\Omega^{-1}\cdot$cm$^{-1}$ or more, the lithium-tantalate crystal can be such that the surface charge generated due to the pyroelectric property is quickly decayed.

According to the present invention, if the single-polarized lithium-tantalate crystal having an optical absorption coefficient of 0.3 cm$^{-1}$ or less at a wave number of 3480 cm$^{-1}$ is subjected to a heat treatment under a reducing atmosphere at a temperature of not less than 250° C. and not more than Curie temperature, the lithium-tantalate crystal of which the electric conductivity is made high with maintaining the single-polarized structure can be produced effectively in a short time. Since the single-polarized lithium-tantalate crystal thus-obtained has an improved electric conductivity of the crystal, accumulation of the charge is not observed on the crystal surface with maintaining the piezoelectric property, and thus it is very advantageous material for the production of the SAW device. Furthermore, the method of the present invention is industrially advantageous since the above lithium-tantalate crystals can be obtained by a quite short-time process.

And a single-polarized lithium-tantalate according to the present invention can be such that an electric conductivity within the wafer is evener and the surface charge generated due to the pyroelectric property is quickly decayed.

DESCRIPTION OF THE INVENTION AND A PREFERRED EMBODIMENT

The present invention will be further described below in detail.

As described above, a lithium-tantalate crystal has a pyroelectric property in addition to a piezoelectric property. Therefore, if the temperature change is applied to the crystal in the production process of the SAW device or the like for which the crystal is used, a surface charge will be generated, a spark discharge or the like is generated between the metal electrodes of the SAW device, which may lead to the degradation of characteristics or the breakage of the device. In order to avoid them, a design and a production process of a SAW device may be restricted in some cases, which may be a factor of restricting the performance and productivity of the device.

Moreover, although there is disclosed a method that a lithium-tantalate crystal is exposed to a reducing atmosphere at 500° C. or more to raise the electric conductivity and the surface charge generated due to the pyroelectric property is quickly neutralized or decayed as described above, it has been found that, at a temperature higher than 610° C. which is the Curie temperature of lithium tantalate, the single-polarized structure needed for a SAW device is lost, and that the reaction rate is very slow even if it is heated at a temperature of 610° C. or less, for example, at 500° C., and thus the surface resistance is still as large as 1.2E+14 Ω for example, and as a result, the electric conductivity of the single-polarized lithium-tantalate crystal cannot be improved industrially.

Then, the inventor of the present invention has studied dedicatedly, and resultingly has found that the lithium-tantalate crystal having an elevated electric conductivity with maintaining a single polarized structure can be produced effectively in a short time by subjecting a single-polarized lithium-tantalate crystal wherein the optical absorption coefficient at a wave number of 3480 cm$^{-1}$ is 0.3 cm$^{-1}$ or less to the heat treatment under a reducing atmosphere at a temperature of not lower than 250° C. and not higher than Curie temperature. And the inventor also has found that a single-polarized lithium-tantalate crystal, wherein an optical absorption coefficient at a wave number of 3480 cm$^{-1}$ is 0.3 cm$^{-1}$ or less and an electric conductivity is made to be $1\times10^{-12}$ $\Omega^{-1}\cdot$cm$^{-1}$ or more by a reduction process, can be such that a color within a wafer surface is less uneven when the wafer is colored with dark gray by the reduction process and an electric conductivity within the wafer is evener, and the surface charge generated due to the pyroelectric property is quickly decayed. And then the inventor finally completed the present invention.

The embodiments of the present invention will be specifically explained below, but the present invention is not limited thereto.

The lithium-tantalate crystal wherein an optical absorption coefficient at a wave number of 3480 cm$^{-1}$ or less is 0.3 cm$^{-1}$ used in the present invention can be obtained by the following methods, for example. First, a lithium-tantalate polycrystal obtained by weighing and mixing lithium carbonate and tantalum pentoxide, and heating them at 1000° C. or more with an electric furnace is put into a crucible made of noble metals such as iridium. Then, it is heated, molten, and then pulled using a seed crystal with being rotated (so-called Czochralski method) to be grown, under the atmosphere consisting of high purity nitrogen mixed with a slight amount of high purity oxygen and containing no water vapor and having the dew point of minus 35° C. or less, and thereby there can be obtained a lithium-tantalate crystal in a multi-domain state (the state where the crystal consists of many polarized domains which are polarized in arbitrary directions), having a diameter, for example, of 4 inches (100 mm).

A noble metal electrode is set on the lithium-tantalate crystal having a diameter of 4 inches (100 mm) in the multi-domain state thus obtained, and a direction of polarization of each polarization domain is arranged in the same direction with the external electric field generated in the crystal by applying a voltage at a temperature of not lower than the Curie temperature, for example at 650° C., and is cooled as it is. Thereby, a single polarization process is conducted. The wafer to which a slicing process has been conducted having a diameter of 4 inches (100 mm) and a thickness of, for example 0.5 mm can be obtained by slicing the single-polarized crystal, for example with a wire saw. And the lapped wafer having a diameter of 4 inches (100 mm) and a thickness of 0.4 mm can be obtained by processing both sides of this wafer with a lapping machine further.

Next, an absorption coefficient of this double-sided lapped wafer is measured by the following method. That is, an absorption coefficient $\alpha$ ($cm^{-1}$) at a wave number of 3480 $cm^{-1}$ as a probe light is calculated by the formula below, for example using the FT-IR analyzing apparatus manufactured by Perkin Elmer.

$$\alpha = A/t$$

A: Absorbance
t: Thickness of a lithium-tantalate wafer (cm)

$$A = Log_{10}(I_0/I)$$

$I_0$: Light intensity when the probe light does not transmit a lithium-tantalate wafer
I: Light intensity when the probe light transmits a lithium-tantalate wafer.

It is considered that the optical absorption at a wave number of 3480 $cm^{-1}$ corresponds to the optical absorption of OH groups in a lithium-tantalate crystal.

Furthermore, since there are generated the reflected light and scattered light which are not received by the photo-detector according to the state of the surface of the wafer, a baseline is provided by a wave number at which there is no optical absorption, and the calculation is performed as follows.

$$A = A_{3480} - A_{base}$$

$A_{3480}$: Absorbance at a wave number of 3480 $cm^{-1}$
$A_{base}$: Absorbance at a baseline $$A_{base} = (A_{3380} + A_{3580})/2$$

$A_{3380}$: Absorbance at a wave number of 3380 $cm^{-1}$
$A_{3580}$: Absorbance at a wave number of 3580 $cm^{-1}$.

As mentioned above, there can be obtained the wafer wherein the optical absorption coefficient at a wave number of 3480 $cm^{-1}$ is 0.3 $cm^{-1}$ or less, more preferably 0.15 $cm^{-1}$ or less by growing the lithium-tantalate crystal according to Czochrolski method using the crucible made of a noble metal under the atmosphere which contains substantially no water vapor.

Next, the method of the heat treatment which raises the electric conductivity may be, for example, conducted as follows: The lapped wafer made of a single-polarized lithium-tantalate crystal obtained as mentioned above, wherein an optical absorption coefficient at a wave number of 3480 $cm^{-1}$ is 0.3 $cm^{-1}$ or less, is put into a stainless steel container, and the stainless steel container is placed into an electric furnace, then hydrogen gas is allowed to flow in the container at a rate of 1.5 l per minute, and the heat treatment is conducted by elevating the temperature in the furnace at a rate of about 6.7° C. per minute from room temperature and keeping at a temperature of not higher than the Curie temperature of a lithium-tantalate crystal, for example, 500° C. for 24 hours, and the temperature in the furnace is lowered at a rate of about 6.7° C. per minute. The wafer is taken from the container of stainless steel when the temperature becomes 30° C. or less.

At this time, the lithium-tantalate crystal to be subjected to the heat-treatment is not only the lapped wafer after being subjected to the lapping process, but also the wafer subjected only to the slicing process, or the wafer after the single surface of the lapped wafer is further subjected to mirror-polishing. The surface of the wafer on which a device is to be formed can be heat-treated more promptly in the case that the wafer subjected at least to a slicing process is heat-treated than in the case that the grown single crystal is subjected to heat treatment before a slicing process.

The temperature of the heat treatment is not restricted to 500° C. If it is 250° C. or more, the effect of making electric conductivity high can be achieved. And if it is the Curie temperature or lower, the electric conductivity can be made high, with maintaining a single polarized structure. Especially, if it is 350° C. or more, the heat treatment time is shortened, and the heat-treatment can be conducted more promptly. The heat treatment time can be adjusted so that the desired electric conductivity may be achieved. And the heat treatment time may be, for example 5-100 hours, and preferably 10-50 hours.

The reducing atmosphere may be not only hydrogen, but also any of reducing gases such as deuterium, carbon monoxide or $NO_X$ (X<2.5), or a mixed gas thereof, and may be those to which a non-reducing gas such as a rare gas, nitrogen, and carbon dioxide or a mixed gas thereof are added. The composition of these atmosphere gases can be suitably selected depending on characteristics of the lithium tantalate to be heat-treated, heat treatment temperature, or the like. Moreover, the heat treatment time can also be adjusted by controlling the composition thereof.

The electric conductivity of the single-polarized lithium-tantalate crystal obtained by the present invention can be measured as follows. That is, the electric conductivity is a reciprocal of a volume resistivity, and the volume resistivity can be obtained from a resistance and the like measured using a measuring instrument such as 4329 A High Resistance Meter and 16008A Resistivity Cell manufactured by Hewlett Packard or the like, according to the following formula.

$$\rho = (\pi d^2/4t) \cdot R$$

$\rho$: Volume resistivity ($\Omega \cdot cm$)
$\pi$: the ratio of the circumference to its diameter
d: Diameter of center electrode (cm)
t: Thickness of lithium-tantalate wafer (cm)
R: Resistance ($\Omega$)

In this case, the voltage of, for example 500 V may be applied to a wafer, and the resistance may be measured one minute after the application of voltage, in order to obtain a stable measurement value.

The electric conductivity of the crystal obtained by the above-mentioned measurement is the value improved by the heat treatment under a reducing atmosphere, and the surface charge generated due to the pyroelectric property or the like is decayed promptly. Therefore, the accumulation of the charge is not observed on the crystal surface with maintaining the piezoelectric property, and is very advantageous material for the production of a SAW device.

And a single-polarized lithium-tantalate crystal, obtained by the method as described above for example, has an optical absorption coefficient at a wave number of 3480 cm$^{-1}$ being 0.3 cm$^{-1}$ or less and an electric conductivity being $1 \times 10^{-12}$ $\Omega^{-1} \cdot$cm$^{-1}$ or more. Thus the lithium-tantalate crystal can be such that a color within a wafer surface is less uneven when the wafer is colored with dark gray by a reduction process, an electric conductivity within the wafer is evener, and the surface charge generated due to the pyroelectric property is quickly decayed.

In the above-mentioned embodiment, the lithium-tantalate crystal wherein an optical absorption coefficient at a wave number of 3480 cm$^{-1}$ is 0.3 cm$^{-1}$ or less is obtained by growing the crystal according to Czochralski method under the atmosphere which contains substantially no water vapor and has the dew point of minus 35° C. or lower. However, the method is not limited thereto. It can be also obtained by subjecting a lithium-tantalate crystal grown under an atmosphere containing water vapor or a wafer obtained by subjecting the crystal to a slicing process, a lapping process or the like, to heat treatment in a vacuum. Alternatively, it can also be obtained by subjecting them to heat-treatment in a gas having a dehydration effect, for example, chlorine.

EXAMPLE

The following examples are being submitted to further explain the present invention. These examples are not intended to limit the scope of the present invention.

Examples 1-11

The lithium-tantalate polycrystal obtained by weighing and mixing lithium carbonate and tantalum pentoxide and heating them at 1000° C. or higher in an electric furnace was supplied to a crucible made of iridium. Then, the lithium-tantalate crystal rotated by 40 to the y-direction, having a diameter of 4 inches (100 mm) and a length of 50 mm was grown by Czochralski method using, as an atmosphere gas, high purity gas consisting of nitrogen which contains 1% of oxygen and having the dew point of minus 35° C. or lower, and then the grown crystal was processed suitably and platinum electrodes were provided thereto. And a single polarization process was conducted at 650° C. After the single-polarized lithium-tantalate crystal was sliced using a wire saw, it was subjected to a lapping process to provide a double-sided lapped wafer having a thickness of 0.4 mm.

Next, the optical absorption coefficient at a wave number of 3480 cm$^{-1}$ of the double-side lapped wafer was calculated using the FT-IR analyzing apparatus manufactured by Perkin Elmer, and was confirmed to be 0.3 cm$^{-1}$ or less.

Ten of the double-sided lapped wafers were placed to be piled in the container made of stainless steel which has a outer diameter of 150 mm and an inner diameter of 130 mm, equipped with a gas pipe. And the atmosphere inside of the container was replaced with a predetermined reducing atmosphere. Then, the cylinder portion of the container made of stainless steel, in which the wafer was placed, was inserted in the tubular furnace of which heater material is a Kanthal wire, and the upper part thereof was heat insulated with wool which consists of alumina silicate, the temperature of the furnace was elevated from room temperature to a predetermined temperature at a rate of about 6.7° C. per minute. After keeping the predetermined temperature for a predetermined time to conduct heat-treatment, the temperature of the furnace was lowered at a rate of about 6.7° C. per minute. The wafer was taken out from the container made of stainless steel when the temperature became 30° C. or less, to provide a dark gray double-sided lapped wafer of a lithium-tantalate crystal subjected to a reduction process.

As shown in Table 1, five batches, that is 50 in total of the black gray double-sided lapped wafers subjected to the reducing process were obtained in each Example by subjecting the wafers produced from the different crystal lots to the similar processing method under a predetermined reducing atmosphere at a predetermined heat treatment temperature for a predetermined heat treatment time.

After lapping both surfaces of each wafer with a lap machine further, the mirror-polishing of a single surface was carried out with a polisher in order for these wafers to have the single side mirror-surface which is standard specification as a substrate for SAW devices, and the single-polarized lithium-tantalate product wafers were obtained. As for these product wafers, the volume resistivity was calculated and the electric conductivity was obtained from the reciprocal thereof. The volume resistivity was calculated as mentioned above from the resistance measured using 4329 A High Resistance Meter, and 16008A Resistivity Cell manufactured by Hewlett Packard. Resistance was measured by applying a voltage of 500 V in a stable state one minute after applying the voltage.

Comparative Examples 1-3

The raw material of lithium tantalate polycrystal was prepared by the similar way to that in Examples. The crystal grown under the general condition without considering the dew point when the crystal was grown according to Czochralski method, or the crystal wherein the obtained lithium-tantalate crystal before a single polarization process was subjected to the heat treatment under an atmosphere containing water vapor like the conventional condition, was cut with a wire saw, and subjected to a lapping process. Comparative example 1 provides the crystal grown under the condition wherein the dew point was not considered, Comparative example 2 provides the crystal obtained by subjecting it to the heat treatment under the atmosphere containing water vapor at 1000° C. for 10 hours, and Comparative Example 3 provides the crystal obtained by subjecting it to the heat-treatment under the atmosphere containing vapor at 1400° C. for 20 hours. Then, the crystals were processed according to the same method as Examples thereafter.

Table 1 shows optical absorption coefficients at a wave number of 3480 cm$^{-1}$, reducing atmospheres, heat treatment temperatures, heat treatment times, and the values of electric conductivity when finishing to be the single side mirror-surface, in Examples 1-11 and Comparative examples 1-3. In Table 1, description such as "1.1E−11" in electric conductivity, means "$1.1 \times 10^{-11}$."

TABLE 1

|  | Treatment Temperature (° C.) | Treatment Time (hour) | Gas Composition at Treatment | Absorption Coefficient at 3480 cm$^{-1}$ (cm$^{-1}$) | Average Conductivity in 5 batches ($\Omega^{-1} \cdot$ cm$^{-1}$) |
|---|---|---|---|---|---|
| Example 1 | 500 | 12 | 100% hydrogen | 0.11 | 6.2E−12 |
| Example 2 | 500 | 24 | 100% hydrogen | 0.15 | 9.1E−12 |
| Example 3 | 500 | 36 | 100% hydrogen | 0.13 | 1.58E−11 |
| Example 4 | 500 | 48 | 100% hydrogen | 0.10 | 2.45E−11 |
| Example 5 | 500 | 24 | 100% hydrogen | 0.30 | 1.66E−12 |
| Example 6 | 600 | 24 | 100% hydrogen | 0.15 | 3.3E−11 |
| Example 7 | 400 | 24 | 100% hydrogen | 0.11 | 6.0E−12 |
| Example 8 | 350 | 24 | 100% hydrogen | 0.14 | 2.7E−12 |
| Example 9 | 250 | 24 | 100% hydrogen | 0.14 | 1.74E−12 |
| Example 10 | 500 | 24 | 100% CO | 0.13 | 4.4E−12 |
| Example 11 | 500 | 24 | 50% hydrogen-50% nitrogen | 0.12 | 3.6E−12 |
| Comparative Example 1 | 500 | 24 | 100% hydrogen | 0.40 | 2.5E−13 |
| Comparative Example 2 | 600 | 48 | 100% hydrogen | 0.97 | 5.0E−15 |
| Comparative Example 3 | 200 | 48 | 100% hydrogen | 0.11 | 6.3E−15 |

From Table 1, it was found that the average electric conductivity of five batches was as high as the value from 1.66E−12 to 3.3E−11 $\Omega^{-1} \cdot$cm$^{-1}$ in Examples 1-11. On the other hand, the electric conductivity of the single side mirror-surface wafers of the lithium-tantalate crystal with an optical absorption coefficient at wave number of 3480 cm$^{-1}$ larger than 0.3 cm$^{-1}$ as in Comparative Examples 1 and 2 was 2.5E−13$^{-1}$·cm$^{-1}$ and 5.0E−15 cm$^{-1}$·cm$^{-1}$, respectively, which were significantly smaller, compared with the values of Examples 1-11. In Comparative Example 3, even if it is the single side mirror-surface wafer of the lithium-tantalate crystal wherein the absorption coefficient at wave number of 3480 cm$^{-1}$ is 0.3 cm$^{-1}$ or less, it also had a significantly small electric conductivity as 6.3E−15 $\Omega^{-1}$·cm$^{-1}$, since it was subjected to the heat-treatment at a low temperature as 200° C. Especially, the appearance of the single side mirror-surface wafer of Comparative Example 1 was only slightly colored one. In the single side mirror-surface wafer of Comparative Examples 2 and 3, change of a color tone was not seen and the electric conductivity is almost the same as that before the processing.

Furthermore, optical absorption coefficients at a wave number of 3480 cm$^{-1}$ of the double-sided lapped wafers after the reduction process in Examples 1-11 were all 0.3 cm$^{-1}$ or less and colors of dark gray within the wafers were still less uneven. On the other hand, an optical absorption coefficient at a wave number of 3480 cm$^{-1}$ of the double-sided lapped wafer after the reduction process in Comparative Example 1 was 0.40 cm$^{-1}$ and a color of dark gray within the wafer was remarkably uneven.

The present invention is not limited to the above-described embodiments. The above-described embodiments is mere examples, and those having the substantially same structure as that described in the appended claims and providing the similar action and effects are included in the scope of the present invention.

What is claimed is:

1. A method of producing a lithium-tantalate crystal, comprising:
   growing a lithium-tantalate crystal according to Czochralski method under an atmosphere which contains substantially no water vapor and has a dew point of minus 350° C. or lower to obtain a lithium-tantalate crystal wherein an optical absorption coefficient at a wave number of 3480 cm$^{-1}$ is 0.3 cm$^{-1}$ or less;
   subjecting the lithium-tantalate crystal to a single-polarization process; and
   subjecting the single-polarized lithium-tantalate crystal wherein an optical absorption coefficient at a wave number of 3480 cm$^{-1}$ is 0.3 cm$^{-1}$ or less to a heat treatment under a reducing atmosphere at a temperature of not lower than 250° C. and not higher than Curie temperature to obtain a single-polarized lithium-tantalate crystal wherein an optical absorption coefficient at a wave number of 3480 cm$^{-1}$ is 0.3 cm$^{-1}$ or less and an electric conductivity of 1×10$^{-12}$ $\Omega^{-1}$·cm$^{-1}$ or more.

2. The method of producing a lithium-tantalate crystal according to claim 1 characterized in that a wafer subjected to at least to a slicing process, a wafer subjected to a lapping process, or a wafer of which a single side is subjected to a mirror polishing process is used as the single-polarized lithium-tantalate crystal.

3. The method of producing a lithium-tantalate crystal according to claim 1 characterized in that the reducing atmosphere is either of hydrogen, deuterium, carbon monoxide and NOx (X<2.5), or a mixed gas consisting of two or more of them.

4. The method of producing a lithium-tantalate crystal according to claim 2 characterized in that the reducing atmosphere is either of hydrogen, deuterium, carbon monoxide and NOx (X<2.5), or a mixed gas consisting of two or more of them.

5. The method of producing a lithium-tantalate according to claim 3 characterized in that one or more of gas selected from rare gases, nitrogen, and carbon dioxide is added further to the reducing atmosphere.

6. The method of producing a lithium-tantalate according to claim 4 characterized in that one or more of gas selected from rare gases, nitrogen, and carbon dioxide is added further to the reducing atmosphere.

7. A single-polarized lithium-tantalate crystal wherein an optical absorption coefficient at a wave number of 3480 $cm^{-1}$ is 0.3 $cm^{-1}$ or less and an electric conductivity is $1 \times 10^{-12}$ $\Omega^{-1} \cdot cm^{-1}$ or more.

8. A method of producing a lithium-tantalate crystal, comprising:

heat-treating in a vacuum a lithium-tantalate crystal grown under an atmosphere containing water vapor or a wafer obtained by subjecting the crystal to a slicing process or a lapping process, to obtain a lithium-tantalate crystal wherein an optical absorption coefficient at a wave number of 3480 $cm^{-1}$ is 0.3 $cm^{-1}$ or less;

subjecting the lithium-tantalate crystal to a single-polarization process; and subjecting the single-polarized lithium-tantalate crystal wherein an optical absorption coefficient at a wave number of 3480 $cm^{-1}$ is 0.3 $cm^{-1}$ or less to a heat treatment under a reducing atmosphere at a temperature of not lower than 250° C. and not higher than Curie temperature to obtain a single-polarized lithium-tantalate crystal wherein an optical absorption coefficient at a wave number of 3480 $cm^{-1}$ is 0.3 $cm^{-1}$ or less and an electric conductivity of $1 \times 10^{-12}$ $\Omega^{-1} \cdot cm^{-1}$ or more.

9. A method of producing a lithium-tantalate crystal, comprising:

heat-treating in a gas that has a dehydration effect a lithium-tantalate crystal grown under an atmosphere containing water vapor or a wafer obtained by subjecting the crystal to a slicing process or a lapping process, to obtain a lithium-tantalate crystal wherein an optical absorption coefficient at a wave number of 3480 $cm^{-1}$ is 0.3 $cm^{-1}$ or less;

subjecting the lithium-tantalate crystal to a single-polarization process; and subjecting the single-polarized lithium-tantalate crystal wherein an optical absorption coefficient at a wave number of 3480 $cm^{-1}$ is 0.3 $cm^{-1}$ or less to a heat treatment under a reducing atmosphere at a temperature of not lower than 250° C. and not higher than Curie temperature to obtain a single-polarized lithium-tantalate crystal wherein an optical absorption coefficient at a wave number of 3480 $cm^{-1}$ is 0.3 $cm^{-1}$ or less and an electric conductivity of $1 \times 10^{-12}$ $\Omega^{-1} \cdot cm^{-1}$ or more.

10. The method according to claim 9, wherein the gas that has a dehydration effect is chlorine.

* * * * *